US007838061B2

(12) United States Patent
Oh et al.

(10) Patent No.: US 7,838,061 B2
(45) Date of Patent: Nov. 23, 2010

(54) METHOD AND APPARATUS FOR FABRICATING HIGH TEMPERATURE SUPERCONDUCTING FILM THROUGH AUXILIARY CLUSTER BEAM SPRAYING, AND HIGH TEMPERATURE SUPERCONDUCTING FILM FABRICATED USING THE METHOD

(75) Inventors: Sang Soo Oh, Changwon-si (KR); Ho Seop Kim, Gimhae-si (KR); Kyu Jung Song, Seoul (KR); Do Jun Youm, Daejeon (KR); Sun Mi Lim, Jeonranam-do (KR); Yong Hwan Jung, Daejeon (KR); Sang Moo Lee, Daejeon (KR); Ye Hyun Jung, Daejeon (KR); Jae Eun Yoo, Daejeon (KR)

(73) Assignee: Korea Electrotechnology Research Institute (KR)

( * ) Notice: Subject to any disclaimer, the term of this patent is extended or adjusted under 35 U.S.C. 154(b) by 880 days.

(21) Appl. No.: 11/653,170

(22) Filed: Jan. 12, 2007

(65) Prior Publication Data

US 2008/0015111 A1 Jan. 17, 2008

(30) Foreign Application Priority Data

Jul. 14, 2006 (KR) ...................... 10-2006-0066090

(51) Int. Cl.
*B05D 5/12* (2006.01)
*B05D 3/14* (2006.01)
*H01L 39/24* (2006.01)
*C23C 14/00* (2006.01)

(52) U.S. Cl. .................... 427/62; 427/526; 427/529; 427/530; 427/531; 427/562; 427/564; 427/569; 427/585; 505/320; 505/473; 505/477

(58) Field of Classification Search .................. 427/62, 427/523–531, 562–564, 569, 585; 505/320, 505/473, 477
See application file for complete search history.

(56) References Cited

U.S. PATENT DOCUMENTS

| 3,615,881 | A | * | 10/1971 | Greene ......................... 148/97 |
| 4,882,023 | A | * | 11/1989 | Wendman ..................... 427/531 |
| 5,079,224 | A | * | 1/1992 | Higuchi ....................... 505/477 |
| 5,284,824 | A | * | 2/1994 | Noda et al. .................. 505/473 |
| 5,907,780 | A | * | 5/1999 | Gilmer et al. ................ 438/299 |
| 6,209,190 | B1 | * | 4/2001 | Chung et al. .................. 29/599 |
| 6,676,811 | B1 | * | 1/2004 | Barnes et al. .......... 204/192.11 |

FOREIGN PATENT DOCUMENTS

| JP | 63-245828 | * 10/1988 |
| JP | 01-061916 | * 6/1989 |
| JP | 03-199107 | * 8/1991 |

* cited by examiner

*Primary Examiner*—Brian K Talbot
(74) *Attorney, Agent, or Firm*—Park & Associates IP Law LLC

(57) ABSTRACT

Disclosed herein is a method of fabricating a high temperature superconducting film in a vacuum chamber through auxiliary cluster beam spraying using an evaporation method, wherein a high temperature superconducting material is deposited on a substrate in a vapor state by evaporating the high temperature superconducting material, and at the same time, a cluster beam material is formed into gas atoms by heating the cluster beam material charged in a housing, and the formed gas atoms pass through a nozzle of an inlet of the housing and then are sprayed and grown on the substrate in the form of the cluster beam, thereby forming pinning centers in the high temperature superconducting film.

12 Claims, 5 Drawing Sheets

METHOD AND APPARATUS FOR FABRICATING HIGH TEMPERATURE SUPERCONDUCTING FILM THROUGH AUXILIARY CLUSTER BEAM SPRAYING, AND HIGH TEMPERATURE SUPERCONDUCTING FILM FABRICATED USING THE METHOD

FIELD OF THE INVENTION

The present invention relates to a method and apparatus for fabricating a high temperature superconducting film through auxiliary cluster beam spraying and a high temperature superconducting film fabricated using the method, and, more particularly, to a method and apparatus for fabricating a high temperature superconducting film through auxiliary cluster beam spraying, which forms nanoparticles in a superconducting film using a method of auxiliarily spraying or growing a cluster beam, so that the pinning force of magnetic flux lines is increased, thereby increasing the critical current density of a superconductor, and a high temperature superconducting film fabricated using the method.

BACKGROUND OF THE INVENTION

Generally, a high temperature superconducting film has been developed in the form of a film in which a superconducting layer is coated on an oxide substrate or a metal substrate. A superconducting wire rod fabricated by coating one or more oxide film layers on a metal substrate and depositing a superconducting layer thereon is referred to as "a superconducting thin film wire rod". The superconducting thin film wire rod has a structure formed of four layers, that is, a metal substrate layer, an oxide buffer layer, a superconducting layer and a stabilizing layer. Techniques for forming a superconducting layer include a Pulsed Laser Depositon (PLD) method, a Metal Organic Deposition (MOD) method, a Metal Organic Chemical Vapor Deposition (MOCVD) method, a Co-Evaporation method and the like.

The most important requirement for the superconducting layer is that the critical current density must be high. In particular, the critical current density must be as high as possible even when a large magnetic field is applied in an arbitrary direction. The limit of the critical current density is determined by the action of pinning centers that fix magnetic flux lines so that the magnetic flux lines are not moved by Lorentz' force when the magnetic flux lines, which intrude from the outside and are distributed in the superconducting layer, are moved by Lorentz' force.

Generally, the pinning centers are defects existing in a superconductor, and are classified into three types. That is, zero-dimensional pinning centers are point defects having almost the same diameters as the magnetic flux lines, one-dimensional pinning centers are dislocations and columnar defects, two-dimensional pinning centers are crystal grain boundaries and planar defects, and three-dimensional pinning centers are precipitates and second phase particles. These pinning centers have different anisotropies of critical current depending on the direction of the magnetic field due to the geometrical differences therebetween, and the characteristics are specified for the pinning centers.

Meanwhile, multi-directional magnetic fields are three-dimensionally formed in the interior, which is wound with a superconducting wire rod, even in the case where the superconducting wire rod is wound and then used as an electromagnet or is used for some other purpose. Accordingly, magnetic anisotropy with respect to critical current density of the superconducting wire rod is required to have various characteristics, therefore various geometrical conditions of the pinning centers are also necessary.

The planar defects are pinning centers inherently existing in a superconducting crystal structure, and copper oxide (CuO) face serves as an example thereof. Further, a crystal grain boundary is also an effective pinning center under a high magnetic field in the case of a low angle misorientation grain boundary. Columnar defects, which are generally generated at the time of growth of a superconducting film, and rod-shaped defects and dislocations, which grow using nanoparticles artificially added as seeds, are well known as the one-dimensional linear defects.

In the MOD method, the artificially added nanoparticles form point defects. It has been reported that the linear defects are formed by adding nano-oxide particles when a high temperature superconducting film is formed on a substrate using the PLD method. That is, a method of increasing the pinning force of the magnetic flux lines using a technique of forming nanorod-shaped linear defects by non-uniformly growing $BaZrO_3$ due to lattice mismatch of superconducting phases and $BaZrO_3$ and nanoparticles and $BaZrO_3$ when Yttrium Barium Copper Oxide (YBCO) target mixed with $BaZrO_3$ nano-oxide particles is deposited using the PLD method (J. L. Macmanus-Driscoll, Nature Materials 3, 2004, p. 439; M. Mukaida, JJAP, 43, 2004, p. 1623; A. Goyal et al, Supercond. Sco. Technol. 18, 2005, p. 1533), and a method of increasing the pinning force of the magnetic flux lines using a technique of forming dislocations, which are linear defects, on $Y_2O_3$ seeds by previously dispersing and forming the $Y_2O_3$ on a substrate in the process of deposition using the PLD method and then depositing the YBCO superconducting film using the PLD method (K. Matsumoto, JJAP 43, 2004, p. 1623), are representative methods that have been reported.

However, the conventional techniques have problems in that, when nanoparticle material is mixed with a superconductor and is then deposited, the nanoparticle material becomes nanoparticles while forming clusters, wherein the clusters are formed depending on thin film growth conditions, so that the conventional techniques are not desirable methods of forming the pinning centers.

SUMMARY OF THE INVENTION

Accordingly, the present invention has been made keeping in mind the above problems occurring in the prior art, and an object of the present invention is to provide a method and apparatus for fabricating a high temperature superconducting film through auxiliary cluster beam spraying, which forms nanoparticles in a superconducting film using a method of auxiliarily spraying or growing a cluster beam itself, so that the pinning force of magnetic flux lines is increased, thereby increasing the critical current density of a superconductor, and a high temperature superconducting film fabricated using the method.

Another object of the present invention is to provide a method and apparatus for fabricating a high temperature superconducting film through auxiliary cluster beam spraying, which can control sizes of clusters in the process of forming the clusters of the nanoparticle material, which is the source of the pinning center, and can enable the control of parameters such as incident direction and incident energy, and a high temperature superconducting film fabricated using the method.

In order to accomplish the above object, the present invention provides a method of fabricating a high temperature superconducting film in a vacuum chamber through auxiliary cluster beam spraying using an evaporation method, wherein: a high temperature superconducting material is deposited on a substrate in a vapor state by evaporating the high temperature superconducting material; and at the same time, a cluster beam material is formed into gas atoms by heating the cluster beam material charged in a housing, and the formed gas atoms pass through a nozzle of an inlet of the housing and then are sprayed and grown on the substrate in the form of the cluster beam, thereby forming pinning centers in the high temperature superconducting film.

Furthermore, the present invention provides an apparatus for fabricating a high temperature superconducting film in a vacuum chamber through auxiliary cluster beam spraying using an evaporation method, the apparatus including a chamber separated from an exterior, connected to a vacuum pump, and exhausted using the vacuum pump; a substrate provided in the chamber; a crucible spaced apart from the substrate and charged with a high temperature superconducting material, which is exhausted to the exterior in a vapor state; and a housing spaced apart from the substrate and charged with a cluster beam material, wherein vapor of the high temperature superconducting material sprayed from the crucible and the cluster beam sprayed from the housing are deposited on the substrate.

Further, the present invention provides a high temperature superconducting film formed in a vacuum chamber through auxiliary cluster beam spraying using an evaporation method, including a superconducting film formed by evaporating a high temperature superconducting material and thus depositing the high temperature superconducting material on a substrate in a vapor state; and pinning centers formed in the superconducting film at the time of forming the superconducting film and formed in the high temperature superconducting film by spraying and growing a cluster beam material charged in a housing on the substrate in the form of the cluster beam.

Here, it is preferred that the cluster beam pass through a nozzle of an inlet of the housing and then be formed.

Furthermore, it is preferred that the substrate be an oxide single crystal substrate or a metal substrate on which a buffer layer is deposited.

Furthermore, it is preferred that the cluster beam be formed in the form of plasma by an electromagnetic device formed around the nozzle, and that the cluster beam be accelerated while passing through a DC high voltage applying device.

Meanwhile, it is preferred that the high temperature superconducting material be an oxide superconducting compound, and that the cluster beam material be a metal oxide.

Accordingly, there is an advantage in that nanoparticles are formed in a superconducting film using a method of forming the superconducting film and simultaneously spraying and growing a cluster beam itself, so that the pinning force of the magnetic flux lines is increased, thereby increasing the critical current density of the superconductor.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE INVENTION

Figure 1:
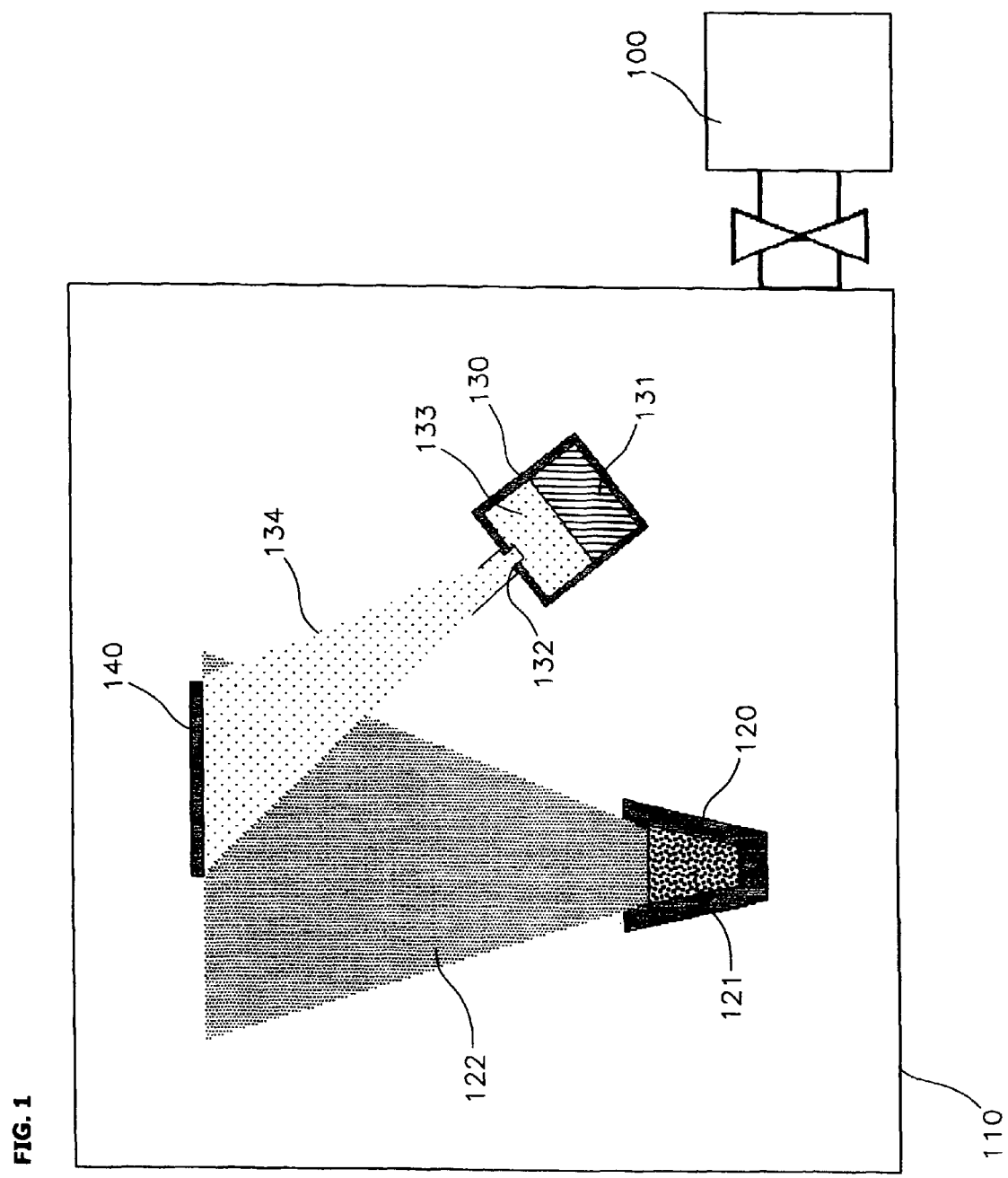
FIG. 1 is a schematic diagram showing a method of depositing a high temperature superconducting film and a method of adding nanoparticles using a cluster beam.

Reference now should be made to the drawings, in which the same reference numerals are used throughout the different drawings to designate the same or similar components.

The present invention will be described in detail with reference to the accompanying drawings below.

FIG. 1 is a schematic diagram showing a method of depositing a high temperature superconducting film and a method of adding nanoparticles using a cluster beam.

As shown in FIG. 1, a vacuum chamber 110, which can be evacuated using a vacuum pump 100, is provided, and a crucible 120, in which a high temperature superconducting material 121 is charged, is disposed in the vacuum chamber 110.

A housing 130, which has an inlet capable of being adjusted in direction, is disposed spaced apart from the crucible 120 by a predetermined interval, and a cluster beam material 131 is charged in the housing 130. The inlet of the housing 130 is formed in the shape of a nozzle 132.

A tape shaped substrate 140 on which a high temperature superconducting film is to be deposited is disposed in the front of the inlet of the crucible 120 and the inlet of the housing 130 with predetermined intervals therebetween. The substrate 140 is an oxide single crystal substrate or a metal substrate on which a buffer layer is deposited.

In this embodiment, an oxide superconducting compound may be used as the high temperature superconducting material 121, and a metal oxide may be used as the cluster beam material 131.

A typical example of the oxide superconducting compound is $ABa_2Cu_3O_{7-x}$ (wherein A is one of Y, Sm, Nd, Gd, Dy and Ho), and a typical example of the metal oxide is MgO.

It will be obvious that the materials of the present invention are not limited to the above materials, and can be applied to any usable materials.

A superconducting film is formed by spraying an auxiliary cluster beam using an evaporation method in the above apparatus. That is, the superconducting film is formed by heating the crucible 120, in which the high temperature superconducting material 121 is charged, using an electromagnetic method or by supplying the high temperature superconducting material 121 in a vapor state 122 to the substrate 140 and depositing it thereon using a method of applying an electromagnetic beam and evaporating materials. In this case, the vapor pressure of the superconducting material in a vapor state 122 is adjusted to be approximately $10^{-5}$ Torr.

At the same time, a beam of nanoparticles is sprayed onto the substrate 140 using an evaporation method of electromagnetically heating the cluster beam material 131 charged in the housing 130. That is, the cluster beam material 131 charged in the housing 130 is heated, and is formed into gas atoms 133.

The atomized cluster beam material passes through a nozzle 132 in the state of the gas atoms 133, and nanoclusters 134 are simultaneously formed due to collisions between the gas atoms. The formed nanoclusters 134 are sprayed and grown on the substrate 140, thereby forming pinning centers. Here, the vapor pressure is maintained at approximately $10^{-4}$ Torr.

Figure 2:
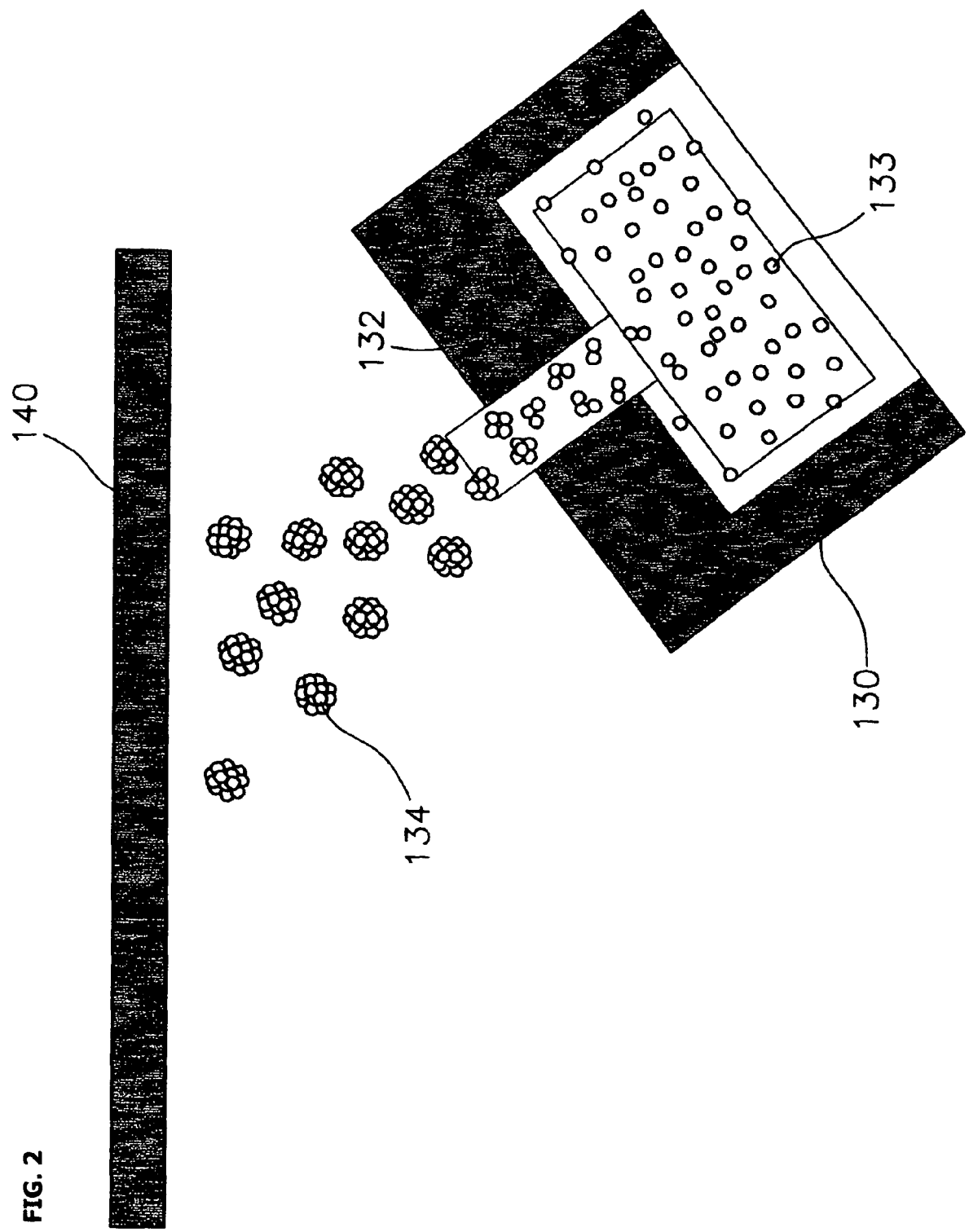
FIG. 2 is a schematic diagram showing a method of forming a cluster beam according to the present invention.

The process of forming a cluster beam will be described with reference to FIG. 2 below.

Generally, a high temperature superconducting film is deposited under an oxygen atmosphere, thus the cluster beam must be sprayed under an oxygen atmosphere.

As described above, a cluster beam material 131 is formed into the gas atoms 133 in a state of highly pressurized vapor, and then the formed gas atoms are sprayed through a nozzle 132. At this time, since the vapor pressure is rapidly decreased, the vapor of the gas atoms 133 is cooled. While the gas atoms 133 pass through the nozzle 132, they collide with each other and agglomerate each other, thereby forming nanoclusters.

The nozzle has a small diameter of 1 mm. Therefore, if a raw material can be oxidized and if oxides adhere to the wall of the nozzle and do not evaporate, the nozzle becomes clogged and thus the function of the nozzle is not maintained. Accordingly, the oxides must be evaporated and thus formed into vapor of the gas atoms, and then the vapor of the gas atoms must pass through the nozzle. In the present invention, the oxides are formed into the vapor of the gas atoms, and then the vapor of the gas atoms pass through the nozzle and then are sprayed on a substrate.

Even though the cluster beam material is added into the superconducting film, it must not chemically affect the superconducting film. That is, the cluster beam material must not chemically affect the formation of the superconducting film, and must not adversely affect the growth of crystal other than the formation of rod defects.

Although these materials may include various materials, MgO is typically used in the present invention.

When MgO is used as the cluster beam material, the cluster beam can be formed as follows. MgO has a vapor pressure of 0.5 Torr at a temperature of 1700° C. Mean free path of the MgO molecules at this vapor pressure is approximately 0.1 mm. Accordingly, when the diameter of the nozzle is 1 mm and the length thereof is 1 mm, the MgO molecules collide about 10 times in the spraying process. Since the MgO molecules collide while expanding, the MgO molecules are formed into nano sized clusters.

MgO is put in a Tantalum tube having several nozzles, and is heated to a temperature of 1700° C. by applying current in order to form the cluster beam.

Figure 3:
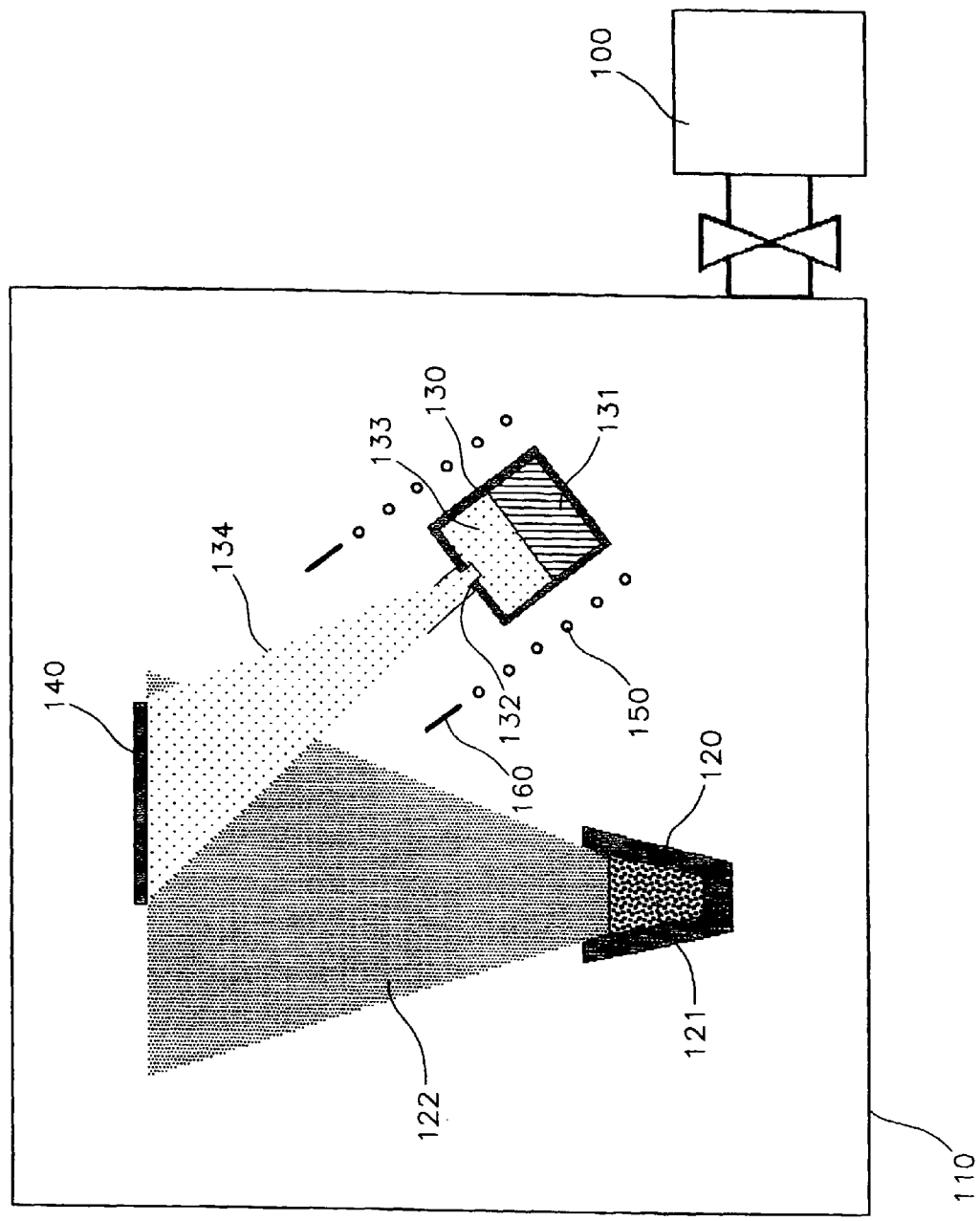
FIG. 3 is a schematic diagram showing a construction in which a cluster beam acceleration apparatus is attached to a housing and a nozzle.

In the present invention, the incident angle of the cluster beam particles is determined by the positional relationship between the substrate and the nozzle. If it is required to adjust the incident energy, as shown in FIG. 3, plasma is formed by attaching an electromagnetic device such as an induction coil 150 to the nozzle, and then an accelerating voltage is applied to the cluster beam through a DC high voltage applying device 160.

Figure 4:
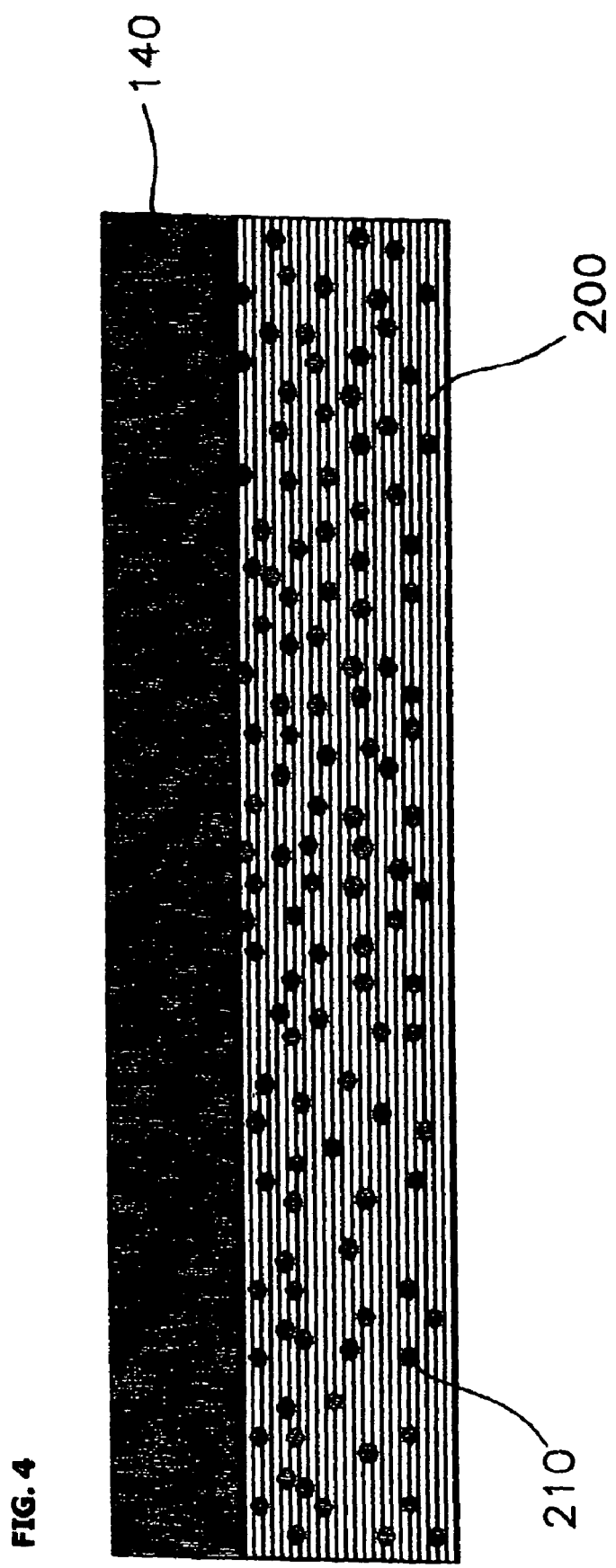
FIG. 4 is a schematic diagram showing a state in which a high temperature superconducting film and pinning centers are formed on a substrate.

As shown in FIG. 4, through the above processes, a high temperature superconducting film 200 is formed on the substrate 140, and pinning centers 210 in the form of point defects are formed in the high temperature superconducting film.

Figure 5:
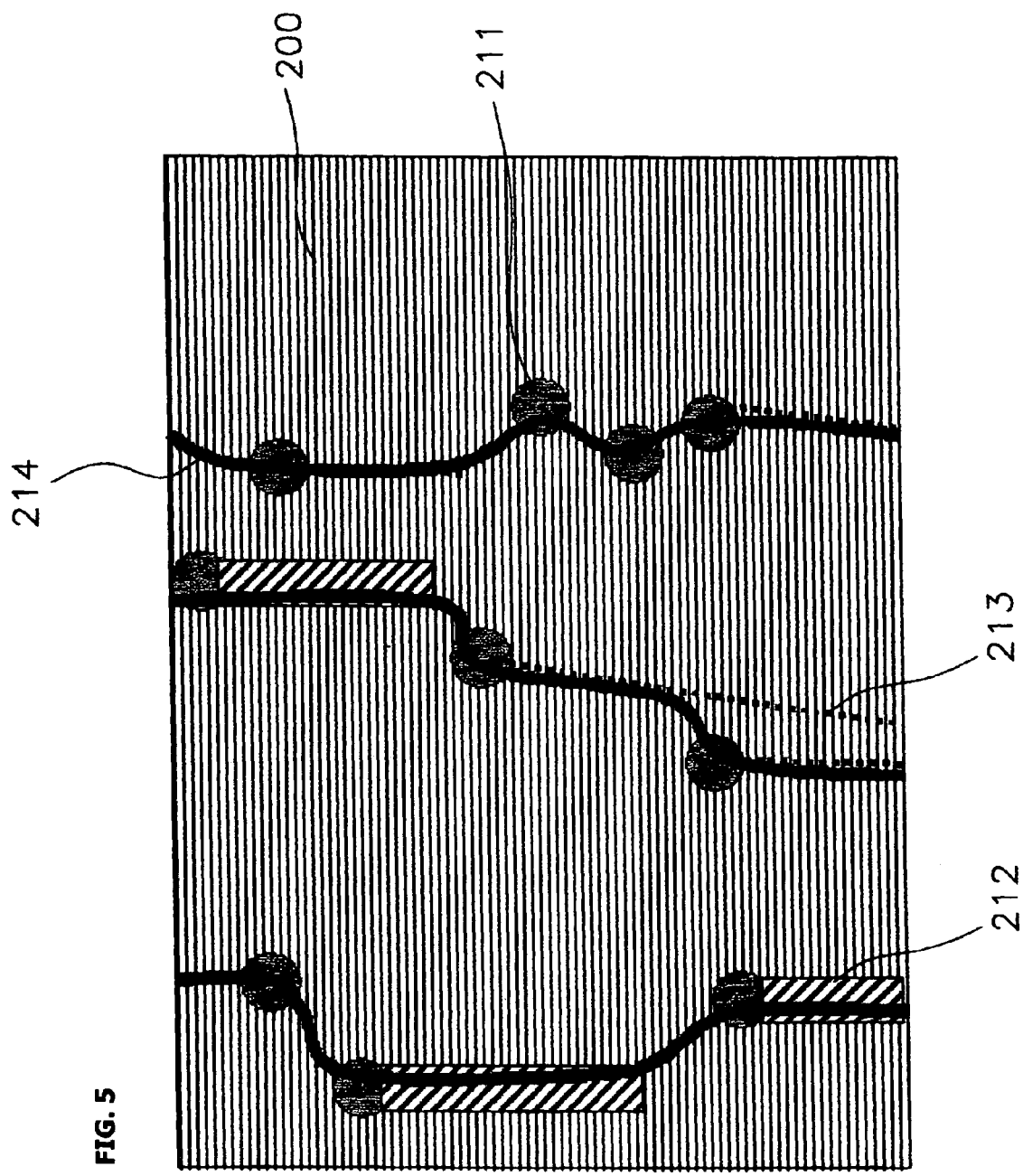
FIG. 5 is a schematic diagram showing the configuration of pinning centers formed in a high temperature superconducting film.

As shown in FIG. 5, in the process of growing nanocluster particles in the superconducting film 200 formed on the substrate, the pinning centers exist in the form of point defects 211, and grows while forming nanorods 212 or dislocations 213.

Accordingly, the pinning force of magnetic flux lines 214 is increased by the pinning centers, thereby increasing the critical current density of the superconductor.

According to the present invention, there is an advantage in that nanoparticles are formed in the superconducting film using a method of auxiliarily spraying and growing a cluster beam itself, so that the pinning force of the magnetic flux lines is increased, thereby increasing the critical current density of the superconductor.

Further, there is an advantage in that, in the process of forming the pinning centers, the density, incident angle and incident energy of the nanoparticles can be arbitrarily adjusted by changing the alignment angle of the housing, the distance between the housing and the substrate, and the heating energy, so that the pinning centers of magnetic flux lines are formed in the form of various densities and distributions, thereby increasing the critical current density characteristics in the magnetic field of the high temperature superconducting wire rod.

What is claimed is:

1. A method of fabricating a high temperature superconducting film comprising:
   providing a substrate in a vacuum chamber;
   depositing a high temperature superconducting material on the substrate after evaporating the high temperature superconducting material in the vacuum chamber;
   forming, a cluster beam material into gas atoms by heating the cluster beam material charged in a material receptacle housing disposed in the vacuum chamber; and
   spraying the formed gas atoms of the cluster beam material over the substrate simultaneously with said depositing the high temperature superconducting material on the substrate, and thereby forming pinning centers in the high temperature superconducting film to increase a critical current density of the superconducting film.

2. The method as set forth in claim 1, wherein the substrate is an oxide single crystal substrate, or a metal substrate on which a buffer layer is deposited.

3. The method as set forth in claim 2, wherein the high temperature superconducting material is an oxide superconducting compound.

4. The method as set forth in claim 3, wherein the high temperature superconducting material is $ABa_2Cu_3O_{7-x}$ wherein A is one of Y, Sm, Nd, Gd, Dy and Ho.

5. The method as set forth in claim 1, wherein the cluster beam material is a metal oxide.

6. The method as set forth in claim 5, wherein the cluster beam material is MgO.

7. The method as set forth in claim 5, wherein the cluster beam is formed in a form of plasma and sprayed through a nozzle of the material receptacle housing.

8. The method as set forth in claim 7, wherein the cluster beam is accelerated by a direct current (DC) high voltage applying device.

9. The method as set forth in claim 1, wherein the pinning centers formed in the high temperature superconducting film are in the form of point defects.

10. The method as set forth in claim 1, wherein the pinning centers formed in the high temperature superconducting film are grown in the form of nanorods or dislocations.

11. The method as set forth in claim 1, wherein the sizes and the density of the pinning centers are controlled by adjusting parameters of said depositing the high temperature superconducting material and said spraying the formed gas atoms of the cluster beam material so as to increase the pinning force of magnetic flux lines in the high temperature superconducting film.

12. The method as set forth in claim 11, wherein the adjustable parameters include the incident direction and incident energy of the gas atoms of the cluster beam material, the distance between the material receptacle housing and the substrate, and the heating temperature of the cluster beam material.

* * * * *